United States Patent [19]

Galani et al.

[11] Patent Number: 4,555,678

[45] Date of Patent: Nov. 26, 1985

[54] MICROWAVE OSCILLATOR

[75] Inventors: Zvi Galani, Bedford; Richard W. Laton, Lexington; Raymond C. Waterman, Jr., Westford; Robert DiBiase, Carlisle, all of Mass.

[73] Assignee: Raytheon Company, Lexington, Mass.

[21] Appl. No.: 554,012

[22] Filed: Nov. 21, 1983

[51] Int. Cl.$^4$ .............................................. H03B 5/22
[52] U.S. Cl. ............................. 331/1 A; 331/107 R; 331/96
[58] Field of Search ............. 331/1 A, 60, 96, 107 R, 331/108 R, 117 D, 117 EE, 117 R

[56] References Cited

U.S. PATENT DOCUMENTS 4,484,156 11/1984 Khanna et al. ....................... 331/96

OTHER PUBLICATIONS

Article by O. Ishihara, T. Mori, H. Sawano and M. Nakatani entitled "A Highly Stabilized GaAs FET Oscillator Using a Dielectric Resonator Feedback Circuit in 9-14 GHz," IEEE Transactions on Microwave Theory and Techniques, vol. MTT-28, No. 8, Aug. 1980, pp. 817-824.

Article by B. T. Debney and J. S. Joshi entitled "A Theory of Noise in GaAs FET Microwave Oscillators and Its Experimental Verification," IEEE Transactions on Electron Devices, vol. ED-30, No. 7, Jul. 1983, pp. 769-776.

Primary Examiner—Eugene LaRoche
Assistant Examiner—G. Wan
Attorney, Agent, or Firm—Philip J. McFarland; Joseph D. Pannone

[57] ABSTRACT

An improvement in a microwave oscillator using a GaAs FET as the active element is shown to include a phase detector responsive to a portion of the positive feedback signals applied to a resonator having a high Q and to a portion of the signals out of the GaAs FET, shifted by 90°, to obtain signals to degenerate noise internally formed in the GaAs FET.

2 Claims, 1 Drawing Figure

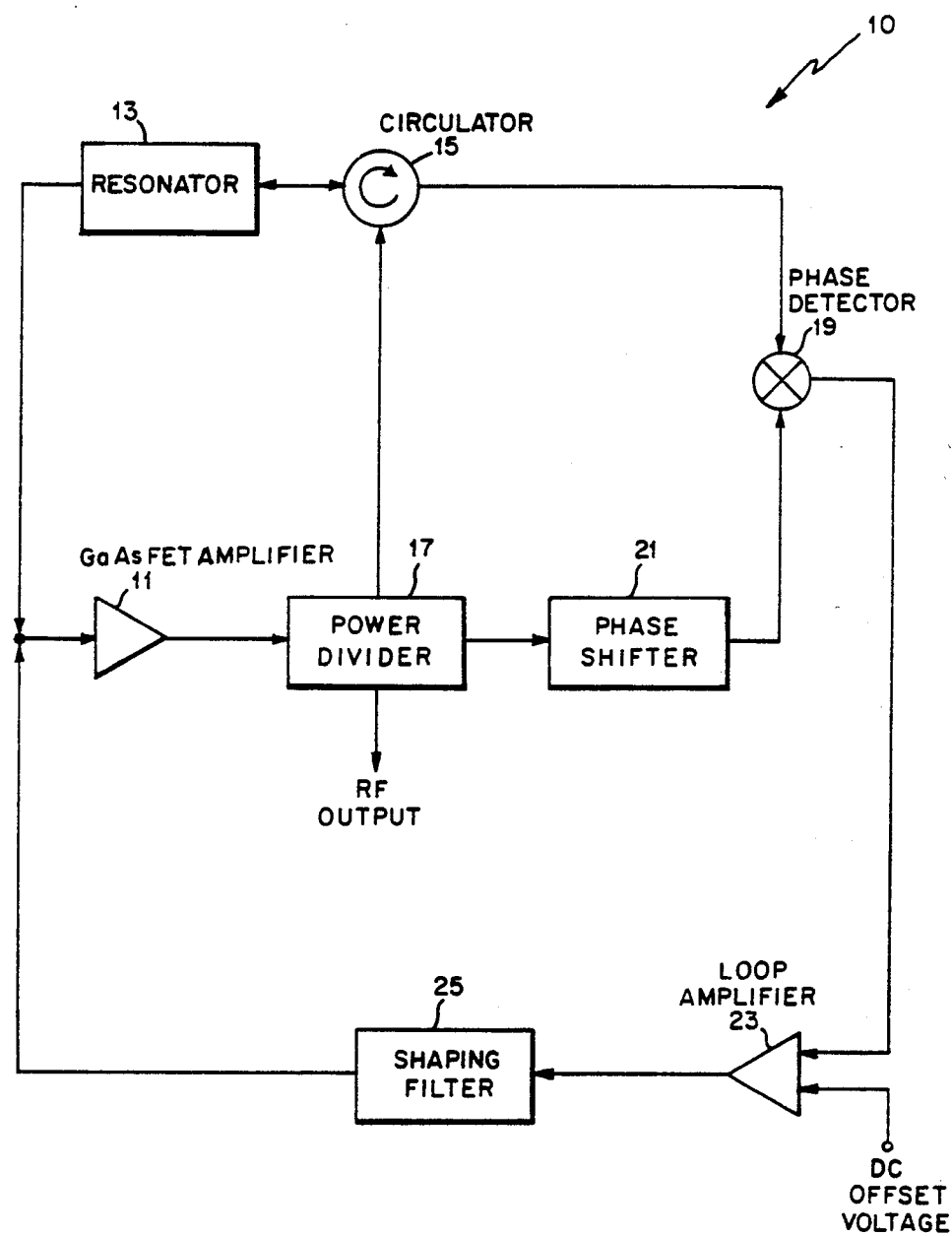

MICROWAVE OSCILLATOR

BACKGROUND OF THE INVENTION

This invention pertains generally to solid state microwave oscillators and in particular to an oscillator having low noise characteristics and incorporating a field effect transistor (FET) as the active element.

It is known in the art that solid state microwave oscillators may utilize diodes (such as GUNN or IMPATT diodes) or triodes (such as bipolar transistors or field effect transistors) as active elements. In many applications, it would be advantageous to use an FET (particularly a so-called gallium arsenide, or GaAs, FET) as the active element in a microwave oscillator. Unfortunately, however, it has heretofore not been possible to reduce the noise characteristics of GaAs FETS to acceptable levels for many applications.

As has been reported, in an article by O. Ishihara, T. Mori, H. Sawano and M. Nakatani entitled "A Highly Stabilized GaAs FET Oscillator Using a Dielectric Resonator Feedback Circuit in 9-14 GHz," IEEE Transactions on Microwave Theory and Techniques, Vol. MTT-28, No. 8, August 1980, pp. 817-824, frequency modulation (FM) noise of a GaAs FET oscillator may be reduced by providing a relatively high Q in the feedback circuit. However, the FM noise, although reduced, is still relatively high. Thus, for example, assuming that the FM noise of an X-band GaAs FET oscillator is typically −65 dBc/Hz at 10 KHz offset from the carrier, the use of a dielectric resonator in the feedback path could reduce this noise to −95 dBc/Hz at the same offset frequency.

As has been reported, in an article by B. T. Debney and J. S. Joshi entitled "A Theory of Noise in GaAs FET Microwave Oscillators and Its Experimental Verification,"IEEE Transactions on Electron Devices, Vol. ED-30, No. 7, July 1983, pp. 769-776, noise in such an oscillator may be attributable in large part to low frequency noise upconverted to the oscillator operating frequency by the nonlinear characteristics of the FET.

SUMMARY OF THE INVENTION

With this background of the invention in mind it is therefore a primary object of this invention to provide a GaAs FET microwave oscillator having low FM noise.

It is another object of this invention to provide a GaAs FET microwave oscillator having better FM noise performance than a GaAs FET microwave oscillator with only a dielectric resonator in its feedback path.

The foregoing and other objects of this invention are generally attained by providing a GaAs FET microwave oscillator having a resonator in the feedback circuit between the drain and gate terminals of the FET, such resonator serving both as a frequency determining element and as a passive dispersive reference element of an interferometer type of frequency discriminator in a frequency-locked loop wherein the output of the discriminator is amplified, shaped, and fed back to the gate terminal of the GaAs FET, via the gate bias port, to further degenerate the low frequency noise of the GaAs FET oscillator.

BRIEF DESCRIPTION OF THE DRAWING

For a more complete understanding of the invention reference is now made to the following description of the accompanying drawing, in which the single FIGURE is a simplified block diagram of a low noise GaAs FET microwave oscillator according to this invention.

DESCRIPTION OF THE PREFERRED EMBODIMENT

Before commencing a detailed exposition of a microwave GaAs FET oscillator according to this invention, it will be constructive at this point to recognize that the FM noise out of a free running oscillator using a solid state device as the active element depends mainly on semiconductor device characteristics and the loaded figure of merit, $Q_L$, of the resonant circuit. Specifically, the level of such noise is inversely related to $Q_L$, leading to the conclusion that the use of a resonator with a relatively high Q may substantially reduce FM noise. It has been determined, however, that the logarithmic dependence of the transmission loss of a resonator upon its $Q_L$ limits the useful value of the $Q_L$ to approximately 65 percent of the unloaded figure of merit, $Q_U$, of the resonator. Thus, if the FM noise of a GaAs FET oscillator is assumed to be −65 dBc/Hz at a 10 kHz offset frequency and the $Q_U$ of an X-band dielectric resonator is assumed to be 3,000, the optimum $Q_L$ of such a resonator would be 2,000 and the use of such a resonator would yield an FM noise of −97 dBc/Hz at a 10 kHz offset frequency. However, because of coupling considerations, the effective $Q_L$ would be further reduced to approximately 1500, with a corresponding FM noise of −94.5 dBc/Hz at the 10 kHz offset frequency. It should also be noted that, for ease of representation, the GaAs FET amplifier here is represented in block form.

Referring now to the single FIGURE, a GaAs FET microwave oscillator according to this invention is shown to include a GaAs FET amplifier 11 having a parallel feedback circuit (not numbered) comprising a resonator 13 (here preferably a YIG filter) resonant at a frequency, $f_o$, a circulator 15 and a power divider 17. It will be appreciated that the foregoing elements form a basic oscillator circuit and the conditions for oscillation are satisfied if the gain of the FET amplifier 11 exceeds the total loss of the feedback circuit (not numbered) and the total phase shift through the feedback circuit and the FET amplifier 11 is an integral multiple of $2\pi$.

Completing the oscillator 10 is a noise degeneration loop (also not numbered) comprising the GaAs FET amplifier 11, the power divider 17, the resonator 13, the circulator 15, a phase detector 19, a phase shifter 21, a loop amplifier 23, and a loop shaping filter 25. It should be appreciated that the resonator 13, the circulator 15, the phase detector 19, and the phase shifter 21 comprise a frequency discriminator in the form of an interferometer. Microwave energy reflected from the resonator 13 is fed to one of the ports of the phase detector 19 via the circulator 15. The power divider 17 provides, via the phase shifter 21, a signal level of approximately 0 dBm to the other port of the phase detector 19. The phase shifter 21 is adjusted to provide a quadrature phase relationship between the input signals to the phase detector 19. The output signal of the phase detector 19 is amplified by the loop amplifier 23, filtered by the shaping filter 25, and fed back to the GaAs FET amplifier 11 via the gate bias port (not shown). A DC offset voltage is summed into the loop amplifier 23 in order to satisfy the gate biasing requirements of the FET amplifier 11. The noise degeneration loop (not numbered) is designed to degenerate the FM noise of the FET oscillator 10 to the level of its noise floor, which is typically set by the noise of the diodes (not shown) in the phase detector 19. The amount of noise degeneration is equal to the product of the oscillator pushing figure, the discriminator sensitivity, and the transfer functions of the loop amplifier 23 and the shaping filter 25. Finally, the useful output signal from the FET oscillator 10 is obtained via a third output port on the power divider 17.

In order to achieve proper discriminator operation, the input port (not numbered) of the resonator 13 must be overcoupled. Where, as here, the resonator 13 is a YIG filter, the desired overcoupling may be accomplished by adjusting the position of the input coupling loop (not shown) of such resonator to provide a transfer function in the form of a conventional S-shaped discriminator curve. The slope of such discriminator curve is controlled by the degree of coupling at the input port (not numbered) of the resonator 13.

The use of the resonator 13 both as the frequency determining element in the feedback path (not numbered) and as part of the noise degeneration circuitry eliminates potential acquisition problems that are characteristic of conventional frequency-locked loops.

Having described a preferred embodiment of the invention, numerous variations may now become apparent to those skilled in the art. For example, the resonator 13 could just as well be comprised of a dielectric resonator placed between two perpendicular microstrip lines, in which case the degree of coupling could be controlled by adjusting the position of the dielectric resonator relative to such perpendicular lines. In addition, it will be evident that the described circuitry could be modified to eliminate the circulator and to add a second power divider at the outout of the resonator so that the requisite inputs to the phase detector could be attained. In this case both the oscillator and the discriminator would utilize the resonator in the transmission mode. It is felt, therefore, that the invention should not be limited in scope to the particular embodiment shown and described, but only by the spirit and scope of the appended claims.

What is claimed is:

1. In a microwave oscillator using a GaAs FET as the active element, such oscillator including a resonator with a high Q to provide positive feedback and to reduce FM noise, the improvement comprising:
    (a) phase detector means, responsive to signals out of the GaAs FET shifted by 90° and to a portion of the positive feedback signals, for providing signals representative of low frequency noise arising within the GaAs FET; and
    (b) means for feeding back the signals out of the phase detector to degenerate such low frequency noise.

2. In a microwave oscillator using a GaAs FET as the active element, such FET having a gate electrode, a drain electrode and a grounded source electrode with a resonator having a high Q in circuit between the drain electrode and the gate electrode to provide positive feedback and to determine the frequency of oscillation, the improvement comprising:
    (a) first means for dividing the signals out of the drain electrode into at least a first and a second path;
    (b) a circulator disposed in circuit in the first path, such circulator having a first, second and third port, the first port receiving signals from the first means, the second port being connected to the resonator and the third port passing therefrom signals reflected from the resonator;
    (c) a phase detector having a first and a second input terminal and an output terminal, the first input terminal receiving the signals out of the third port of the circulator;
    (d) a 90° phase shifter disposed in the second path between the first means and the second input terminal of the phase detector; and,
    (e) second means, connected in circuit between the output terminal of the phase detector and the gate electrode of the GaAs FET, for applying such electrode signals to degenerate internally formed noise.

* * * * *